United States Statutory Invention Registration [19]

[11] Reg. Number: H416

Colvin [43] Published: Jan. 5, 1988

[54] HIGH CAPACITANCE FLEXIBLE CIRCUIT

[75] Inventor: Kevin W. Colvin, Corona, Calif.

[73] Assignee: Rogers Corporation, Rogers, Conn.

[21] Appl. No.: 864,821

[22] Filed: May 19, 1986

Related U.S. Application Data

[63] Continuation of Ser. No. 297,987, Aug. 31, 1981, abandoned.

[51] Int. Cl.[4] ..... H05K 1/18

[52] U.S. Cl. ..... 361/398; 361/306; 361/313; 361/401; 361/414

[58] Field of Search ..... 361/414, 395, 401, 412, 361/398, 419; 174/52 P, 72 B; 340/365 C

[56] References Cited

U.S. PATENT DOCUMENTS

| | | | |
|---|---|---|---|
| 3,266,125 | 8/1966 | Tobolski | 361/401 X |
| 3,921,167 | 11/1975 | Fox | 361/398 X |
| 4,064,552 | 12/1977 | Angelucci et al. | 361/414 |
| 4,263,659 | 4/1981 | Hirata et al. | 340/365 C X |
| 4,346,257 | 8/1982 | Moss et al. | 174/72 B |
| 4,359,720 | 11/1982 | Chai et al. | 340/365 C |
| 4,436,953 | 3/1984 | Gottlieb | 174/72 B |

*Primary Examiner*—Stephen C. Buczinski
*Assistant Examiner*—Linda J. Wallace
*Attorney, Agent, or Firm*—Fishman & Dionne

[57] ABSTRACT

A multilayer flexible circuit is provided with integral capacitors. These capacitors are in the form of rigid dielectric elements embedded within the flexible circuit at appropriate locations between two circuit patterns. The circuit pattern may include inductors which cooperate with the capacitors to provide filtering.

9 Claims, 3 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HIGH CAPACITANCE FLEXIBLE CIRCUIT

This application is a continuation of application Ser. No. 297,987, filed Aug. 31, 1981, now abandoned.

BACKGROUND OF THE INVENTION

1. Field of the Invention

The present invention relates to passive electronic devices and particularly to multilayer flexible circuits characterized by high capacitance. Specifically, the present invention is directed to flexible circuits having ceramic capacitors embedded therein and, in some applications, also including inductors connected to the capacitors.

2. Description of the Prior Art

Flexible circuits are well known and have been widely used. A typical multilayer flexible circuit will be comprised of at least two non-conductive plastic sheets having conductive circuit patterns supported on at least one planar surface of each sheet. These sheets will customarily be positioned so that the circuit patterns face each other, but are not in electrical contact. Electrical isolation between the conductors patterns on the two sheets will usually be accomplished by spatially separating the sheets through the use of an intermediate nonconductive layer. This intermediate layer may either be a further plastic sheet, adhesively bonded to the circuit supporting sheets, or a nonconductive binder.

Prior flexible circuits have a capacitance which is so low as to be comparatively ineffective in any frequency sensitive circuit, such as a filter or network, noise.

In order to overcome this disadvantageous low capacitance, discrete capacitors were often inserted into terminal holes in the circuit and soldered into place. This required additional assembly time and expense. Furthermore, the solder connections were subject to environmental degradation, and are typically points of higher resistance in the circuit.

SUMMARY OF THE PRESENT INVENTION

The present invention overcomes the above-discussed disadvantages and other deficiencies of the prior art by embedding capacitive elements, at appropriate locations, within a multilayer flexible circuit.

In accordance with the present invention, a flexible circuit may be comprised of at least two plastic films or substrates which have a conductive circuit pattern disposed on at least one surface. These films are arranged so that the circuit patterns are facing, but not in contact with, each other. Capacitive elements are positioned between appropriate sections of the two circuit patterns and thus are sandwiched between the substrates. Preferably, the entire circuit pattern is disposed on a single film which is then folded to define the multilayer device. These capacitive elements are comprised of chips or wafers of a material having a high dielectric constant with the two opposite surfaces of each chip being provided with a conductive coating.

The capacitive elements may be held in place by a conductive binder and the binder may also act as the conductive surface coating of the capacitors. A spacer sheet, comprised of a plastic film, may be provided with cut-outs for locating and retaining the capacitors in the proper position. Alternatively, it is possible to mechanically secure the capacitive elements between the circuit patterns by any suitable means.

The flexible circuits, i.e., the circuit patterns on the substrates, may include etched inductors which cooperate with the capacitive elements to form high pass, low pass or band pass filter circuits.

The present invention is suitable for use in keyboard switching assemblies, to add filtering or decoupling directly in a cable or flex package, to define tuned circuits for many applications, and for many other applications.

BRIEF DESCRIPTION OF THE DRAWING

The present invention may be better understood and its numerous objects and advantages will become apparent to those skilled in the art by reference to the accompanying drawing wherein like reference numerals refer to like elements in the several FIGURES and in which.

DESCRIPTION OF THE PREFERRED EMBODIMENT

Figure 1:
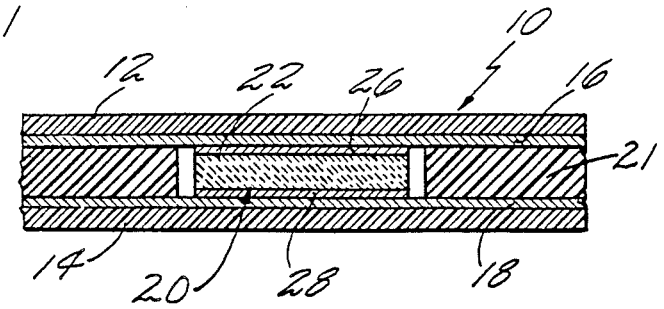
FIG. 1 is a cross-sectional side elevation view of a flexible circuit in accordance with the present invention.

Referring to FIG. 1, a flexible circuit in acccordance with the present invention is indicated generally at 10. Circuit 10 is comprised of two plastic layers 12 and 14. Layers 12 and 14 may be of any suitable nonconductive material, such as Kapton® or Mylar®. Conductor patterns 16 and 18 are respectively supported on the facing surfaces of layers 12 and 14. Conductors 16 and 18 may be formed from any suitable conductive material and by any suitable method. By way of example, conductors 16 and 18 may be comprised of a copper foil which has been bonded to the respective surfaces of layers 12 and 14, with the desired pattern being formed by chemical etching subsequent to bonding. Alternatively, conductors 16 and 18 might be formed by screen printing a conductive ink upon the respective surfaces of layers 12 and 14.

Positioned between the layers 12 and 14, and in contact with a desired section of conductors 16 and 18, is at least one capacitive element which has been indicated generally at 20. Element 20 is comprised of a chip or wafer of a material characterized by a high dielectric constant. The two opposite surfaces of chip 22 are respectively provided with conductive coatings 26 and 28.

Chip 22 may be comprised of any suitable high dielectric material. Preferably, this material has a dielectric constant in excess of 3,000. This material will typically be a ceramic, such as barium titanate. The conductive surfaces 26 and 28, i.e., the plates of the capacitor, may be comprised of any suitable material such as a conductive adhesive, tin or copper plating, or a paladium-silver plating.

Element 20 may have any desired dimension, depending upon the intended end use of the flexible circuit. Typically, chip 22 will be approximately 10 mils thick and will range in width and length between approximately 0.150 to 0.200 inches. Conductive coatings 26 and 28 will typically have a thickness of between 50 and 500 microinches.

Element 20 is retained between substrates 12 and 14 by any suitable method. By way of example, element 20 may be bonded between layers 12 and 14 with a conductive adhesive, which may also form conductive coatings 26 and 28. Preferrably, a sheet of nonconductive material 21 will be positioned between substrates 12 and 14. This separator sheet 21 will have cut-outs for receiving the elements 20. The flexible circuit 10 may also be hermetically sealed thus encapsulating element 20 within circuit 10. This protects both the conductors 16 and 18 and the capacitive elements 20 from environmental degradation.

Figure 2:
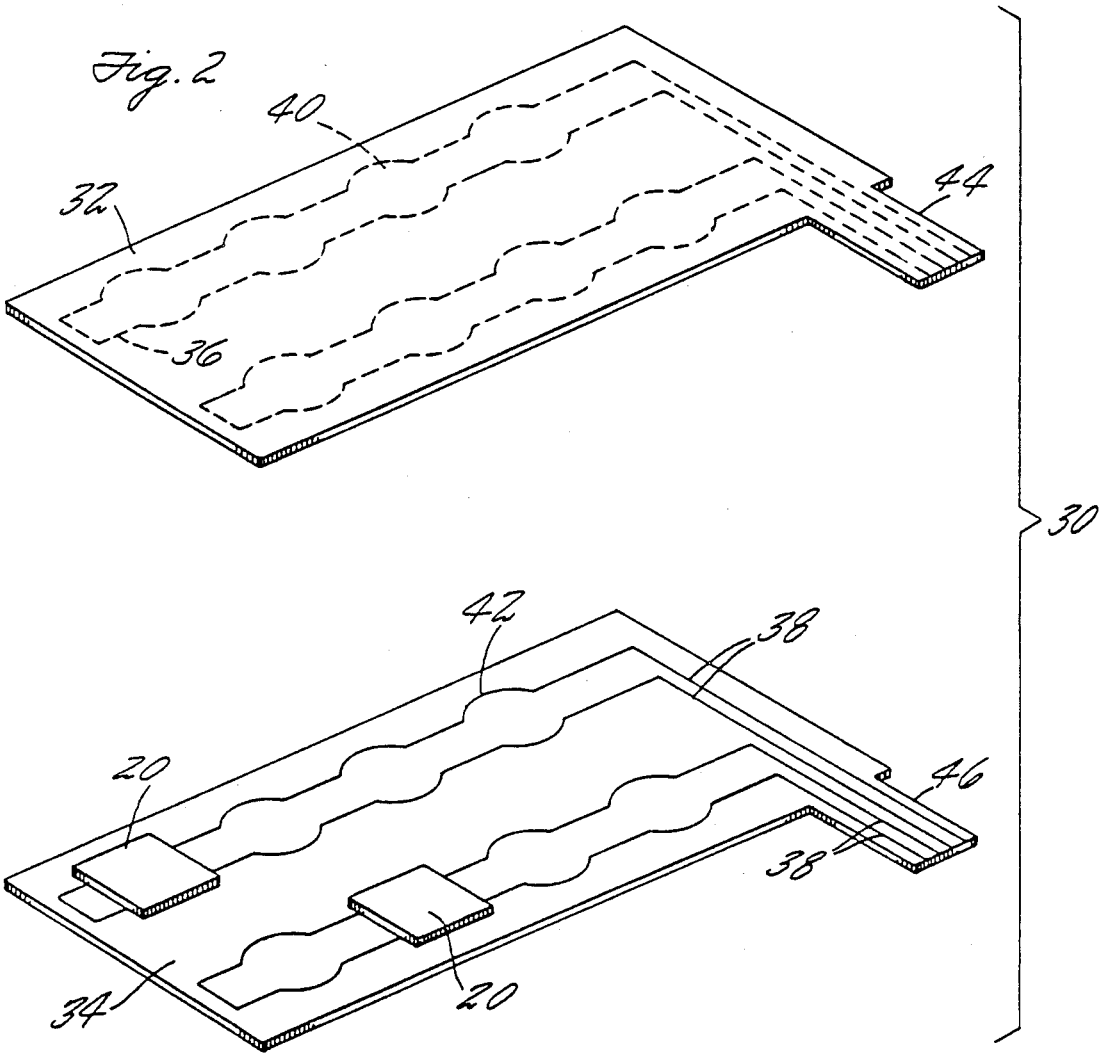
FIG. 2 is a perspective exploded view of a flexible circuit in accordance with the present invention.

Referring now to FIG. 2, an exploded view of an embodiment of a flexible circuit in accordance with the present invention is indicated generally at 30. Circuit 30 includes flexible plastic layers 32 and 34 having conductors 36 and 38 disposed on their respective facing surfaces. Conductors 36 and 38 are provided with portions 40 and 42, respectively, of enlarged area. Furthermore, layers 32 and 34 are provided with transversely extending termination portions 44 and 46 respectively. Conductors 36 and 38 extend into respective termination portions 44 and 46.

Capacitive elements 20 are positioned between layers 32 and 34. Elements 20 are the same as discussed above and require no further explanation. Furthermore, as also explained above, there are numerous methods of bonding or retaining elements 20 between layers 32 and 34.

Figure 3:
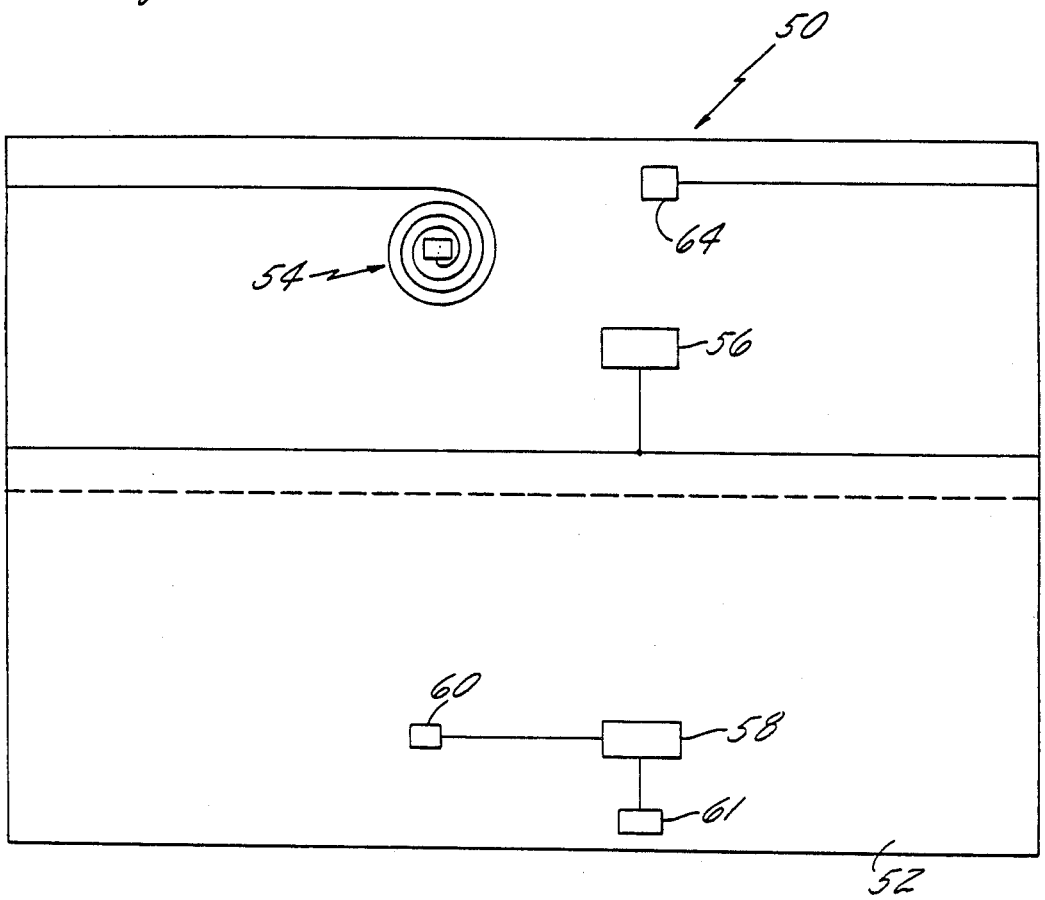
FIG. 3 is a schematic plan view of a circuit in accordance with the invention, including inductive and capacitive circuit components, at an intermediate stage of fabrication.

It is also possible to incorporate into a circuit of the present invention an etched inductor or inductors to cooperate with elements 20 to define a filter or filters. One illustration of such a circuit is seen generally at 50 in FIG. 3. Circuit 50 is deposited upon a nonconductive layer 52, usually a plastice. Circuit 50 includes a coil 54, capacitor chip mounting areas 56 and 58, and conductive contact pads 60 and 61. By folding layer 52, along line 62, the pads 60 and 61 and placed in electrical contact with contact points 63 and 64, respectively, to complete the circuit.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A high capacitance flexible circuit comprising:

a first flexible circuit sheet, said first flexible circuit sheet having first and second sides, said second side having a defined electrically conductive pathway means disposed thereon;

a second flexible circuit sheet, said second flexible circuit sheet having first and second sides, said first side having a defined electrically conductive pathway means disposed thereon, said first side facing but not in contact with said second side of said first flexible circuit sheet; and at least one capacitor chip, said capacitor chip comprising a generally rectangular flat wafer of dielectric material disposed between a pair of oppositely disposed planar conductive outer surfaces, said capacitor being positioned between said first and second flexible circuit sheets, said conductive outer surfaces of said capacitor chip being in electrical contact with appropriate sections of said electrically conductive pathway means on said first and second flexible circuit sheets.

2. The assembly of claim 1 wherein said capacitor is comprised of a dielectric material having a dielectric constant of at least 3,000.

3. The assembly of claim 1 wherein said electrically conductive pathway of said first circuitry layer includes an inductor.

4. The assembly of claim 1 wherein said electrically conductive pathway is comprised of a copper foil etched circuit pattern.

5. The assembly of claim 1 wherein said electrically conductive pathway is comprised of conductive ink.

6. The assembly of claim 1 wherein said capacitor is comprised of a ceramic wafer having a width and length ranging between 0.150 to 0.200 inches.

7. The assembly of claim 6 wherein said planar conductive outer surfaces of said capacitor have a thickness ranging between 50 to 500 microinches.

8. The assembly of claim 1 further including:

a spacer layer of flexible insulating material, said spacer layer being positioned between said first and second flexible circuit sheets, said spacer layer being provided with cut-outs for receiving said capacitor.

9. A high capacitance flexible circuit assembly comprising:

a flexible circuitry layer, said layer having first and second sides, said second side having two defined electrically conductive pathways disposed thereon, said pathways being spatially separated so as to form a longitudinal section running between them the length of said circuitry layer, said circuitry layer being folded along a line through said longitudinal section so as to position said two defined electrically conductive pathways to face but not contact each other; and at least one capacitor, said capacitor comprising a generally rectangular flat wafer of dielectric material disposed between a pair of oppositely disposed planar conductive outer surfaces, said capacitor being positioned within said folded flexible circuit layer, said conductive outer surfaces of said capacitor being in electrical contact with appropriate sections of said defined electrical conductive pathways.

* * * * *